(12) United States Patent
Sakamoto et al.

(10) Patent No.: US 9,133,055 B2
(45) Date of Patent: Sep. 15, 2015

(54) GLASS BASE MATERIAL

(75) Inventors: Akihiko Sakamoto, Shiga (JP);
Yoshimasa Kawamura, Shiga (JP);
Masakazu Tanida, Shiga (JP); Masato Muguruma, Shiga (JP); Yusuke Himei, Shiga (JP)

(73) Assignee: NIPPON ELECTRIC GLASS CO., LTD., Otsu-shi, Shiga (JP)

( * ) Notice: Subject to any disclaimer, the term of this patent is extended or adjusted under 35 U.S.C. 154(b) by 0 days.

(21) Appl. No.: 14/233,229

(22) PCT Filed: Jul. 9, 2012

(86) PCT No.: PCT/JP2012/067513
§ 371 (c)(1),
(2), (4) Date: Jan. 16, 2014

(87) PCT Pub. No.: WO2013/011860
PCT Pub. Date: Jan. 24, 2013

(65) Prior Publication Data
US 2014/0144492 A1    May 29, 2014

(30) Foreign Application Priority Data

Jul. 19, 2011  (JP) ................................. 2011-157469
Jul. 2, 2012   (JP) ................................. 2012-148148

(51) Int. Cl.
| C03C 21/00   | (2006.01) |
| H01L 31/02   | (2006.01) |
| C03C 3/087   | (2006.01) |
| C03C 4/00    | (2006.01) |
| C03C 23/00   | (2006.01) |
| H01L 31/0236 | (2006.01) |
| H01L 31/0392 | (2006.01) |

(52) U.S. Cl.
CPC ............... *C03C 21/002* (2013.01); *C03C 3/087* (2013.01); *C03C 4/0035* (2013.01); *C03C 23/008* (2013.01); *H01L 31/02* (2013.01); *H01L 31/02366* (2013.01); *H01L 31/03923* (2013.01); *Y02E 10/541* (2013.01)

(58) Field of Classification Search
None
See application file for complete search history.

(56) References Cited

U.S. PATENT DOCUMENTS

| 5,093,196    | A  | * | 3/1992  | Hecq et al. ..................... 428/410 |
| 2001/0055930 | A1 | * | 12/2001 | Ott et al. ........................... 445/9 |
| 2007/0056662 | A1 | * | 3/2007  | Fagan et al. ................... 148/712 |
| 2011/0159219 | A1 | * | 6/2011  | Yue et al. ..................... 428/34.4 |
| 2012/0238435 | A1 | * | 9/2012  | Arai et al. ........................ 501/70 |
| 2013/0160845 | A1 | * | 6/2013  | Kuroiwa et al. .............. 136/256 |

FOREIGN PATENT DOCUMENTS

| JP | 2008010401 A      | * | 1/2008 |
| WO | WO 2011068225 A1  | * | 6/2011 |
| WO | WO 2012014854 A1  | * | 2/2012 |

* cited by examiner

*Primary Examiner* — David Sample
(74) *Attorney, Agent, or Firm* — Drinker Biddle & Reath LLP

(57) ABSTRACT

Provided is a glass base material having excellent sodium feeding capability as a glass base material for solar cells such as compound semiconductor solar cells. The invention is concerned with a glass base material which is used for solar cells, wherein on at least one surface thereof, a sodium concentration in a depth of 0.2 μm from the surface of the glass base material is 0.55 or larger in terms of a relative value relative to a sodium concentration in a depth of 1 μm from the surface of the glass base material.

6 Claims, 3 Drawing Sheets

(a)

(b)

(a)

(b)

(a)

(b)

GLASS BASE MATERIAL

TECHNICAL FIELD

The present invention relates to a glass base material which is used for solar cells, in particular compound semiconductor solar cells made of copper (Cu)-indium (In)-selenium (Se) (hereinafter expressed as "CIS"), copper (Cu)-indium (In)-gallium (Ga)-selenium (Se) (hereinafter expressed as "CIGS"), or the like.

BACKGROUND ART

A solar cell is roughly classified into a bulk type solar cell and a thin film solar cell. The thin film solar cell is a solar cell in which a semiconductor thin film having a thickness of about several microns is provided as an electric power generation layer on a base material, and its spread in the future is expected as a solar cell with excellent electric power generation efficiency per manufacturing cost (cost performance) because a small amount of semiconductor materials required for the electric power generation is enough as compared with a bulk type solar cell. Above all, compound semiconductor solar cells are expected to be possible to realize a more excellent cost performance because in comparison with thin film silicon solar cells, not only the electric power efficiency is excellent, but a degree of freedom of a manufacturing process is high. In particular, CIS and CIGS solar cells are expected to rapidly spread in the future as a safe solar cell with an excellent cost performance because in comparison with a cadmium (Cd)-tellurium (Te) solar cell that is the same compound semiconductor solar cell, not only excellent electric power generation efficiency is obtained, but cadmium that is a harmful substance is not contained therein (see, for example, Patent Literature 1).

In general, the compound semiconductor solar cell has a structure in which an electrode made of molybdenum or the like, a compound semiconductor layer made of CIS or CIGS or the like, a buffer layer made of CdS or ZnS or the like, and a transparent electrically conductive film made of ZnO, AZO (aluminum-doped zinc oxide) or ITO (tin-doped indium oxide) or the like are formed in this order on a glass base material.

CITATION LIST

Patent Literature

Patent Literature 1: JP-A-8-330614

SUMMARY OF THE INVENTION

Problems to be Solved by the Invention

It is known that in a compound semiconductor solar cell such as a CIS or CIGS solar cell, in view of the fact that sodium (Na) is contained in a semiconductor crystal, a composition stable region of the crystal expands, whereby the electric power generation efficiency of the solar cell becomes high.

In order to incorporate sodium into a compound semiconductor layer, there is enumerated a method for feeding sodium or a sodium-containing compound as a raw material during the film formation of a semiconductor crystal. However, according to this method, though the addition amount of sodium is easily controllable, there is involved such a problem that the steps become complicated.

As other methods, there is enumerated a method for diffusing sodium in a glass base material into a compound semiconductor layer via a metal electrode made of molybdenum or the like in a manufacturing step. This method is simple in the steps and excellent in the cost performance. However, the conventional glass base materials which are used for solar cells were insufficient in sodium feeding capability into the compound semiconductor layer.

In view of the foregoing circumstances, the invention has been made, and its object is to provide a glass base material having excellent sodium feeding capability as a glass base material for solar cells such as compound semiconductor solar cells.

Means for Solving the Problems

The invention is concerned with a glass base material which is used for solar cells, wherein on at least one surface thereof, a sodium concentration in a depth of 0.2 μm from the surface of the glass base material is 0.55 or larger in terms of a relative value relative to a sodium concentration in a depth of 1 μm from the surface of the glass base material.

In a manufacturing step of a solar cell, the diffusion of sodium from a glass base material into a compound semiconductor layer is a phenomenon which takes place in an extremely surface layer of the glass base material, and the sodium distribution state in the glass base material surface layer greatly affects the sodium feeding capability into the compound semiconductor layer. In consequence, it is important to assign a composition design of a glass base material suited for compound semiconductor solar cells to a design while paying attention to a composition around the surface of the glass base material but not to an average composition of the whole of the glass base material. Specifically, excellent sodium feeding capability can be obtained by regulating the concentration distribution of sodium of the surface layer of the glass base material in the foregoing way.

Secondly, in the glass base material of the invention, it is preferable that a sodium concentration distribution curve in a depth direction in the glass base material exhibits a bending point in a depth of smaller than 0.2 μm from the surface of the glass base material; and that an average concentration gradient of sodium between the surface of the glass base material and the bending point is 2 or larger in terms of a relative value relative to an average concentration gradient of sodium between the bending point and a position in a depth of 0.2 μm from the surface of the glass base material.

In order that sodium may be continuously fed from the surface of the glass base material into the compound semiconductor layer, sodium must be always replenished from the inner part into the surface of the glass base material. The movement of a component in the glass base material can be dealt as a diffusion phenomenon and is expressed according to the following Fick's first law. A diffusion amount J of a component passing through a unit cross-sectional area within a unit time is proportional to a concentration gradient of the component at that position, and a constant of proportionality thereof is called a diffusion coefficient.

$$J = -D(dc/dx)$$

In the expression, c represents a concentration of the component; x represents a distance; $dc/dx$ represents a concentration gradient of the component; and D represents a diffusion coefficient. Since the component diffuses from a high side toward a low side in the concentration, the diffusion coefficient is given a negative symbol. That is, it is meant that when the concentration gradient is large in a positive side, the amount of the component which diffuses within a unit time is large, and a diffusion rate of the component is fast.

According to the investigations made by the present inventors, it has become clear that in the case where the sodium concentration gradient in the glass base material surface layer is large, a concentration distribution curve thereof once exhibits a bending point in a depth of smaller than 0.2 μm from the surface of the glass base material, and thereafter, the concentration increases with a more gently gradient toward the inner part of the glass base material. In consequence, when a ratio of the average concentration gradient of sodium of from the surface of the glass base material to the bending point and the average concentration gradient of sodium in the more inner part (between the bending point and the position in a depth of 0.2 μm from the surface of the glass base material) satisfies the foregoing range, the diffusion amount and diffusion rate of sodium from the inner part to the surface of the glass base material become large, so that it becomes possible to efficiently replenish sodium into the surface of the glass base material.

Incidentally, the bending point refers to a point at which a secondary differentiation of the concentration in the sodium concentration distribution curve (=d/dx (dc/dx)) becomes maximum in a negative sense.

Thirdly, in the glass base material of the invention, it is preferable that a potassium concentration distribution curve in a depth direction in the glass base material exhibits a minimum value in a depth of 0.05 μm or smaller from the surface of the glass base material.

In a portion where sodium decreases around the surface of the glass base material, since a cation is insufficient, the glass base material is liable to be negatively charged; however, there may be the case where potassium (K) is concentrated in the neighborhood thereof and exists as a cation, thereby playing a role to keep a balance of electric charges. Accordingly, even when the same alkali metal elements are concerned, potassium exhibits a different behavior from sodium and is liable to also exhibit a different pattern in the concentration distribution from sodium.

In the case where the glass base material contains potassium, in view of the fact that potassium is concentrated in a portion in a depth of 0.05 μm or smaller from the surface of the glass base material, it may be considered that a balance of electric charges is effectively arranged, so that it becomes possible to efficiently feed sodium. Incidentally, the concentration distribution state of potassium can be specified by a position of a minimum value of the concentration distribution curve as generated as a result of concentration of potassium in the glass base material surface layer.

Fourthly, in the glass base material of the invention, it is preferable that a strain point is 520° C. or higher.

When the strain point of the glass base material satisfies the foregoing range, it becomes easy to prepare a glass base material satisfying a prescribed sodium concentration in the surface layer for the reasons as described later. In addition, deformation of the glass base material to be caused due to heat in a manufacturing step of a solar cell can be suppressed.

Fifthly, in the glass base material of the invention, it is preferable that the sodium concentration in a depth of 0.01 μm from the surface of the glass base material is 0.02 or larger in terms of a relative value relative to the sodium concentration in a depth of 1 μm from the surface of the glass base material.

When the sodium concentration in a depth of 0.01 μm from the surface of the glass base material is prescribed as above, the sodium concentration distribution around the surface of the glass base material becomes precipitous, the diffusion amount or diffusion rate of sodium becomes large, so that it becomes possible to efficiently replenish sodium into the surface of the glass base material.

Sixthly, in the glass material of the invention, it is preferable that the ratio of the sodium concentration in a depth of 0.01 μm from the surface of the glass base material to the total amount of the concentration of calcium, strontium and barium in a depth of 0.01 μm from the surface of the glass base material is 5 or larger.

According to the research by the present inventors, in order to increase sodium feeding capability at the surface of the glass base material, it is found to be preferable to increase the ratio of the sodium concentration to the concentration around the surface of the glass base material of alkali earth elements such as calcium, strontium and barium. Specifically, when the ratio of the sodium concentration in a depth of 0.01 μm from the surface of the glass base material to the total amount of the concentration of calcium, strontium and barium in a depth of 0.01 μm from the surface of the glass base material is arranged within the forgoing range, it becomes possible to obtain more excellent sodium feeding capability.

MODES FOR CARRYING OUT THE INVENTION

Figure 1:
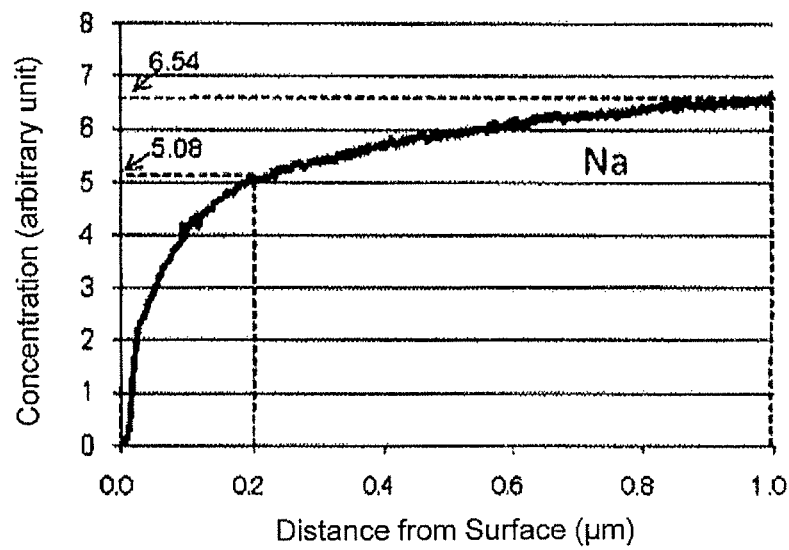
FIG. 1(a) is a graph showing a sodium concentration distribution of a glass substrate surface layer in Example 1.
FIG. 1(b) is a graph showing a concentration distribution of each of sodium and potassium of a glass substrate surface layer in Example 1.
Figure 1:
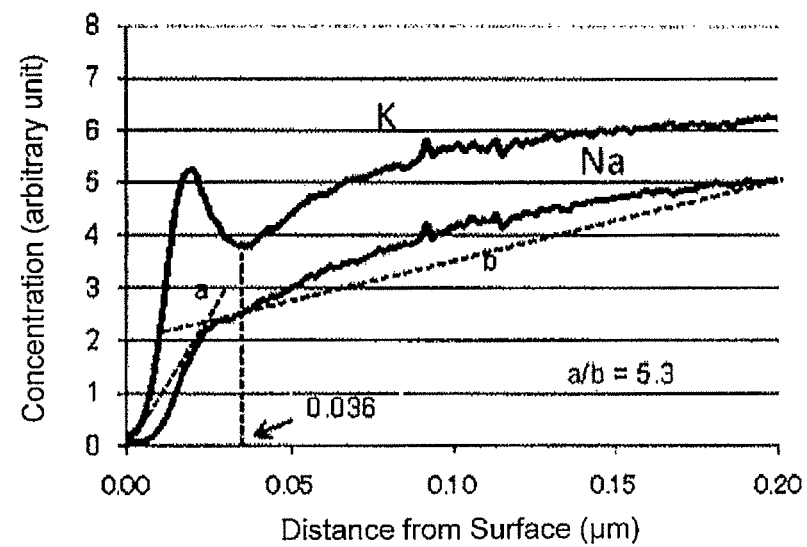

In the glass base material of the invention, on at least one surface thereof, a sodium concentration in a depth of 0.2 μm from the surface of the glass base material is 0.55 or larger in terms of a relative value relative to a sodium concentration in a depth of 1 μm from the surface of the glass base material. When the relative value is too small, there is a tendency that the sodium feeding capability into the compound semiconductor layer is insufficient. The range of the relative value is preferably 0.65 or larger, and more preferably 0.75 or larger. Incidentally, though an upper limit thereof is not particularly limited, it is actually not larger than 0.99, and furthermore not larger than 0.9.

In addition, in the glass base material of the invention, it is preferable that a sodium concentration distribution in a depth direction of the glass base material exhibits a bending point in a depth of smaller than 0.2 μm from the surface of the glass base material; and that an average concentration gradient of sodium between the surface of the glass base material and the bending point is 2 or larger in terms of a relative value relative to an average concentration gradient of sodium between the bending point and a position in a depth of 0.2 μm from the surface of the glass base material. When the relative value is too small, the diffusion amount or diffusion rate of sodium from the inner part to the surface of the glass base material becomes small, so that sodium is hardly replenished with efficiency into the surface of the glass base material. The range of the relative value is preferably 4 or larger, and more preferably 8 or larger. Incidentally, though an upper limit thereof is not particularly limited, it is actually not larger than 50, and especially not larger than 20.

Furthermore, in the glass base material of the invention, it is preferable that a potassium concentration distribution curve in a depth direction in the glass base material exhibits a minimum value in a depth of 0.05 μm or smaller from the surface of the glass base material. The position of the minimum value is more preferably 0.04 μm or smaller, and still more preferably 0.03 μm or smaller from the surface of the glass base material. When the position of the minimum value exceeds the foregoing range and excessively approaches to the inner part side of the glass base material, there is a concern that after sodium moves into the compound semiconductor layer, the electric charges are liable to become unbalanced in the surface layer of the glass base material, and the sodium diffusion capability is lowered.

In the glass base material of the invention, it is preferable that the sodium concentration in a depth of 0.01 μm from the surface of the glass base material is 0.02 or larger in terms of a relative value relative to the sodium concentration in a depth of 1 μm from the surface of the glass base material. The range of the relative value is more preferably 0.2 or larger, still more preferably 0.3 or larger, especially preferably 0.4 or larger and most preferably larger than 0.45.

In the glass base material of the invention, it is preferable that the ratio of the sodium concentration in a depth of 0.01 μm from the surface of the glass base material to the total amount of the concentration of calcium, strontium and barium in a depth of 0.01 μm from the surface of the glass base material is 5 or larger. The range of the ratio is more preferably 10 or larger, still preferably 15 or larger, still more preferably 20 or larger.

Incidentally, in order to detect a concentration change of the component in the portion extremely near the surface of the glass base material, the glow discharge optical emission spectroscopy (GD-OES) is effective. This is a method for detecting the component from the light-emitting state of the surface of the glass base material while sputtering the surface of the glass base material with comparatively small energy. According to this method, since the energy giving to the surface of the glass base material is smaller than that according to the secondary ion mass analysis, the movement of the component in the glass hardly takes place during the analysis. Accordingly, the concentration of the component in a portion extremely near the surface of the glass base material can be quantitatively determined with high spatial resolution, and concentration distribution information with high precision can be obtained. The concentration of the component in a portion near the surface of the glass base material of the invention is defined as the relative value based on the concentration of each component in a depth of 1 μm from the surface of the glass base material.

The concentration distribution of sodium around the surface of the glass base material is affected by a forming process of a molten glass, various surface treatments after forming, or the like. For example, in a forming process according to the float process, when a residence time on a tin bath is long, or a temperature of the molten glass is high, an evaporation amount of sodium from the molten glass surface becomes large. In addition, there is known a method in which in order to prevent the occurrence of scratching after forming, an $SO_2$ gas is sprayed onto the surface of the glass base material to form $Na_2SO_4$ on the surface of the glass base material. However, even according to this method, sodium on the surface of the glass base material is extracted. Furthermore, it is also known that sodium elutes from the surface of the glass base material due to the contact with water or a water vapor and reacts with carbon dioxide in air to form a carbonate. In this way, since sodium existing in the glass base material tends to be extracted in the manufacturing step, there is a tendency that the sodium concentration in the glass base material becomes lower when the position becomes closer to the surface of the glass base material. Incidentally, it is noted that calcium (Ca) also exhibits the same concentration distribution.

On the other hand, as already described, potassium around the surface of the glass base material tends to be distributed so as to keep a balance of the electric charges in a portion where sodium (or calcium) decreases.

In this way, the concentration distribution of each of sodium and potassium of the surface layer of the glass base material varies depending upon various factors. In particular, the foregoing prescribed concentration distribution is easily satisfied by increasing the temperature at the time of spraying an $SO_2$ gas onto the surface of the glass base material for the purpose of preventing the occurrence of scratching after forming, or decreasing the concentration of an $SO_2$ gas.

In particular, the sodium concentration around the surface of the glass base material is easily kept at a high level relative to the decrease of the concentration of alkali earth elements such as calcium, strontium and barium around the surface of the glass base material.

A strain point of the glass base material of the invention is preferably 520° C. or higher, more preferably 550° C. or higher, still more preferably 580° C. or higher and especially preferably 600° C. or higher. When the strain point of the glass base material is too low, heat deformation is liable to take place in the manufacturing step such as $SO_2$ gas spraying and film formation of an electrode or the like.

As a composition of the glass base material of the invention (average composition of the whole of the glass base material), for example, the following range (mass percentage) is enumerated.

$SiO_2$: 45 to 65%
$Al_2O_3$: 1 to 18%
$Li_2O$: 0 to 5%
$Na_2O$: 1 to 10%
$K_2O$: 0 to 15%
$MgO$: 0 to 12%
$CaO$: 0 to 12%
$SrO$: 0 to 18%
$BaO$: 0 to 18%
$ZrO_2$: 0 to 10%

The reasons why the glass composition is preferred in the foregoing range are described below.

$SiO_2$ is a component for forming a network of the glass, and its content is from 45 to 65%, preferably from 46 to 60% and more preferably from 46 to 55%. When the content of $SiO_2$ is too small, the strain point tends to become low. On the other hand, when the content of $SiO_2$ is too large, the melting temperature becomes high, and therefore, melting property is liable to be lowered, or devitrification is liable to take place at the time of forming.

$Al_2O_3$ is a component for increasing the strain point, and its content is from 1 to 18%, preferably from 2 to 15%, more preferably from 7 to 15%, still more preferably from 11.1 to 15% and especially preferably from 12 to 15%. When the content of $Al_2O_3$ is too small, an effect for increasing the strain point is hardly obtained. On the other hand, when the content of $Al_2O_3$ is too large, the melting temperature becomes high, and therefore, the melting property is liable to be lowered, or devitrification is liable to take place at the time of forming.

All of $Li_2O$, $Na_2O$, and $K_2O$ are a component for not only enhancing the melting property of the glass but controlling a thermal expansion coefficient. When the content of these components is too small, the melting temperature becomes high, and the melting property is liable to be lowered. On the other hand, when the content of these components is too large, the strain point is liable to become low. Incidentally, in order to sufficiently obtain the foregoing effects, it is preferable to properly regulate a total content of these components. Specifically, the total content of $Li_2O$, $Na_2O$, and $K_2O$ is preferably from 7 to 20%, more preferably from 7 to 15%, and still more preferably from 8 to 13%.

All of MgO, CaO, SrO, and BaO are a component for not only enhancing the melting property but controlling a thermal expansion coefficient. When the content of these components is too large, devitrification is liable to take place at the time of forming. Incidentally, in order to sufficiently obtain the foregoing effects, it is preferable to properly regulate a total content of these components. Specifically, the total content of MgO, CaO, SrO, and BaO is preferably from 10 to 27%, and more preferably from 15 to 25%.

$ZrO_2$ is a component for not only increasing the strain point but enhancing chemical durability. The content of $ZrO_2$ is from 0 to 10%, and preferably from 1 to 7%. When the content of $ZrO_2$ is too large, devitrification is liable to take place at the time of forming.

In addition to the foregoing components, the glass base material can contain $TiO_2$ as a component for suppressing coloration (solarization) of the glass by ultraviolet rays. When the glass base material contains an iron ion (in an amount of, for example, from 0.01 to 0.2%) as impurities, coloration by the iron ion is liable to take place through a long-term use of a solar cell using the glass base material. Then, by incorporating $TiO_2$, this kind of coloration can be suppressed. The content of $TiO_2$ is from 0 to 5%, preferably from 0.01 to 4%, and more preferably from 1 to 4%. When the content of $TiO_2$ is too large, devitrification is liable to take place at the time of forming.

In addition, $SnO_2$, $Sb_2O_3$, $As_2O_3$, $SO_3$, and the like may be incorporated as a fining agent in a total content of from 0 to 1%. When the content of these components is too large, devitrification is liable to take place at the time of forming.

The glass base material of the invention exhibits excellent effects especially in the case where it is used as a base material of a solar cell having a compound semiconductor such as CIS and CIGS. However, it should not be construed that the kind of the compound semiconductor as an object is limited thereto. For example, the glass base material of the invention is also applicable to compound semiconductors using, for example, silver (Ag) as the Group I element, aluminum (Al) as the Group III element, sulfur (S) as the Group VI element, and the like. Furthermore, the glass base material of the invention is also applicable to so-called CZTS based solar cells composed of Cu, zinc (Zn), tin (Sn), Se or S, and the like.

The form of the glass base material of the invention is not particularly limited, but examples include a plate form or a tube form.

EXAMPLES

The glass substrate as one example of use of the glass base material of the invention is hereunder described in detail by reference to the following Examples, but it should not be construed that the invention is limited to these Examples.

Examples 1 and 2

Raw material powders were compounded so as to have the following glass composition.
$SiO_2$: 56%
$Al_2O_3$: 7%
$Na_2O$: 4%
$K_2O$: 7%
MgO: 2%
CaO: 2%
SrO: 9%
BaO: 9%
$ZrO_2$: 4%

The raw material powders were melted at a prescribed temperature, formed into a plate form having a thickness of 1.8 mm by the float process, and then cooled by a continuous annealing furnace. In order to prevent the occurrence of scratching on the glass substrate surface, an $SO_2$ gas was introduced into the inside of the annealing furnace and brought into contact with the glass substrate surface at 650 to 700° C. In Example 1, after annealing, water washing was conducted, whereas in Example 2, after annealing, polishing was conducted, thereby removing a sulfate deposited on the glass substrate surface.

Figure 2:
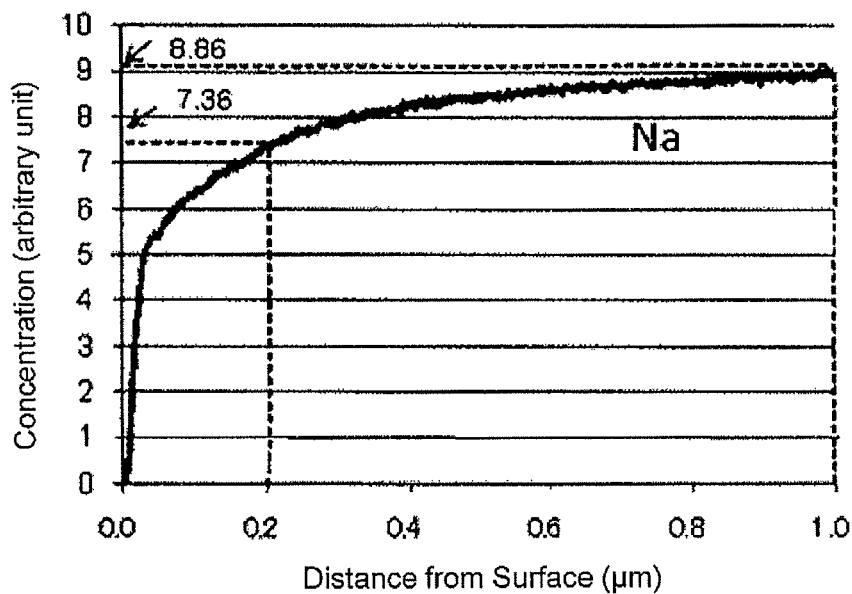
FIG. 2(a) is a graph showing a sodium concentration distribution of a glass substrate surface layer in Example 2.
FIG. 2(b) is a graph showing a concentration distribution of each of sodium and potassium of a glass substrate surface layer in Example 2.
Figure 2:
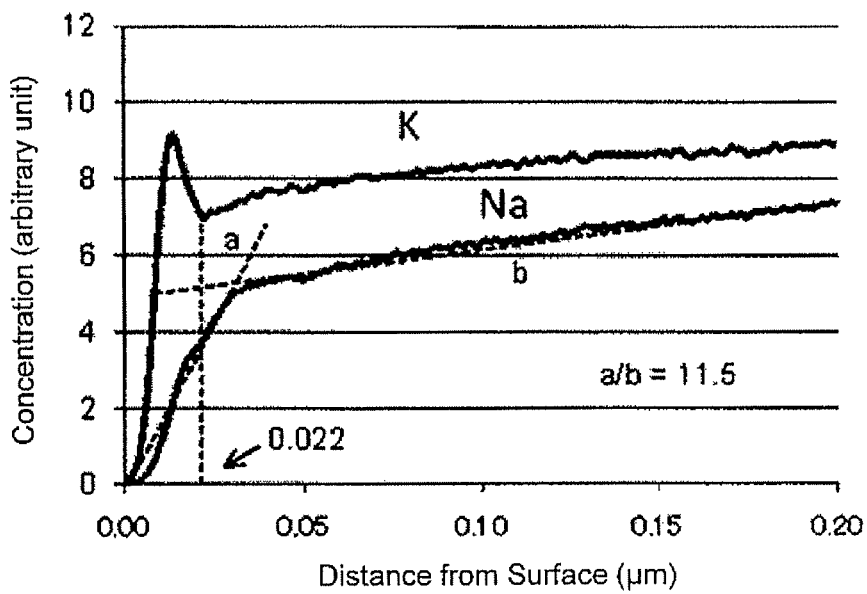

Subsequently, the concentration distribution of each of sodium, potassium and alkali earth metal in an surface layer of the obtained glass substrate was determined by means of GD-OES. The results are shown in FIGS. 1 and 2 and Table 1. Incidentally, in the graphs of FIGS. 1 and 2, the abscissa axis represents a distance (depth) from the glass substrate surface, and the ordinate axis represents a concentration (arbitrary unit). In addition, in FIG. 1($b$) and FIG. 2($b$), the dotted line a shows an average concentration gradient of sodium between the glass substrate surface and the bending point; and the dotted line b shows an average concentration gradient of sodium between the bending point and a position in a depth of 0.2 μm from the glass substrate surface.

Example 3

Raw material powders were compounded so as to have the following glass composition.
$SiO_2$: 51%
$Al_2O_3$: 13%
$Na_2O$: 6%
$K_2O$: 4%
CaO: 5%
SrO: 12%
BaO: 4%
$ZrO_2$: 5%

Using the obtained raw material powders, a glass substrate was prepared in the same manner as that in Example 1.

The concentration distribution of each of sodium, potassium and alkali earth metal in an surface layer of the obtained glass substrate was determined by means of GD-OES. The results are shown in Table 1

Comparative Example

A glass substrate was prepared in the same manner as that in Example 1, except for changing the temperature at the time of bringing $SO_2$ into contact with the glass substrate to 500 to 600° C.

Figure 3:
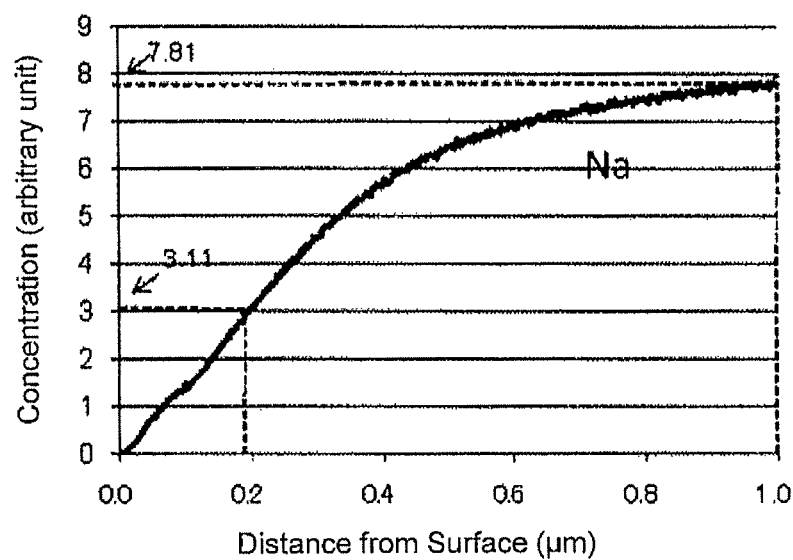
FIG. 3(a) is a graph showing a sodium concentration distribution of a glass substrate surface layer in Comparative Example.
FIG. 3(b) is a graph showing a concentration distribution of each of sodium and potassium of a glass substrate surface layer in Comparative Example.
Figure 3:
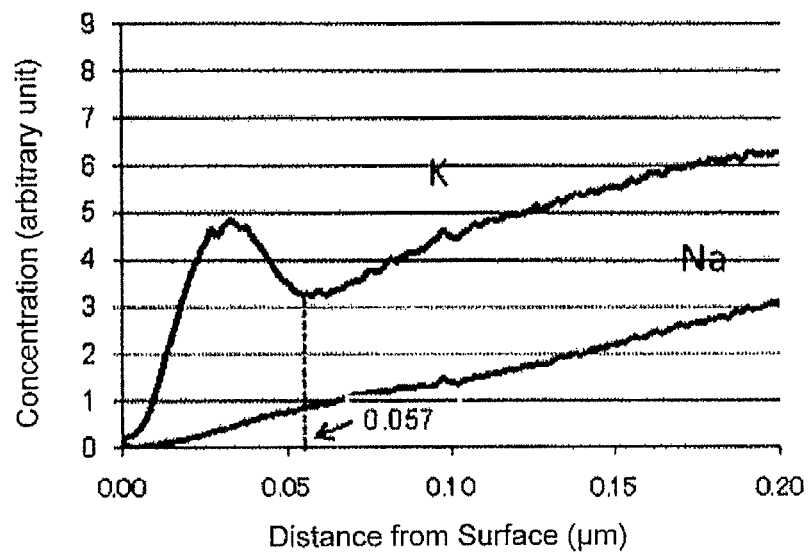

The concentration distribution of each of sodium, potassium and alkali earth metal in a surface layer of the obtained glass substrate was determined by means of GD-OES. The results are shown in FIG. 3 and Table 1.

TABLE 1

|  | Example | | | Comparative Example |
|---|---|---|---|---|
|  | 1 | 2 | 3 |  |
| $SO_2$ treatment temperature (° C.) | 650 to 700 | 650 to 700 | 650 to 700 | 500 to 600 |
| Treatment after annealing | Water washing | Polishing | Water washing | Water washing |
| (Na concentration in a depth of 0.2 μm)/(Na concentration in a depth of 1 μm) | 0.78 | 0.83 | 0.88 | 0.4 |
| (Average concentration gradient a between surface and bending point)/(Average concentration gradient b between bending point and position in a depth of 0.2 μm) | 5.3 | 11.5 | 29 | — |
| Position of minimum value in K concentration distribution curve (μm) | 0.036 | 0.022 | 0.026 | 0.057 |
| (Na concentration in a depth of 0.01 μm)/(Na concentration in a depth of 1 μm) | 0.05 | 0.1 | 0.5 | 0.01 |
| (Na concentration in a depth of 0.01 μm)/(total amount of Ca, Sr and Ba concentration in a depth of 0.01 μm) | 1.3 | 0.7 | 24.9 | 1.0 |
| Strain point | 580 | 580 | 615 | 580 |

As shown in FIGS. 1 and 2 and Table 1, in the glass substrates of Examples 1 to 3, the sodium concentration in a depth of 0.2 μm from the glass substrate surface was from 0.78 to 0.88 relative to the sodium concentration in a depth of 1 μm from the glass substrate surface, which were larger than 0.5. In addition, in the sodium concentration distribution curves, the bending point was present at a position in a depth of smaller than 0.2 μm from the glass substrate surface, and the ratio of the average concentration gradient a of sodium between the glass substrate surface and the bending point to the average concentration gradient b between the bending point and the position in a depth of 0.2 μm from the glass substrate surface was from 5.3 to 29, which were larger than 2. Furthermore, the position of a minimum value in the potassium concentration distribution curve was from 0.022 μm to 0.036 μm from the glass substrate surface, which were positioned 0.05 μm or smaller from the glass substrate surface. In the light of the above, it may be said that since all of the glass substrates of Examples 1 to 3 satisfy the requirements of the invention, they have excellent sodium feeding capability into the compound semiconductor layer in the manufacture of, for example, a compound semiconductor solar cell. Incidentally, as shown in Table 1, in the glass substrate of Example 3, the ratio of the sodium concentration in a depth of 0.01 μm from the glass substrate surface to the sodium concentration in a depth of 1 μm from the glass substrate surface was as large as 0.5; and the ratio of the sodium concentration in a depth of 0.01 μm from the glass substrate surface to the total amount of the concentration of calcium, strontium and barium in a depth of 0.01 μm from the glass substrate surface was as large as 24.9; so that it may be said that the glass substrate has especially excellent sodium feeding capability.

On the other hand, as shown in FIG. 3 and Table 1, in the glass substrate of Comparative Example, the sodium concentration in a depth of 0.2 μm from the glass substrate surface was 0.4 relative to the sodium concentration in a depth of 1 μm from the glass substrate surface, which was smaller than 0.5. In addition, in the sodium concentration distribution curve, a distinct bending point was not found at a position in a depth of smaller than 0.2 μm from the glass substrate surface. Furthermore, the position of a minimum value in the potassium concentration distribution curve was 0.057 μm from the glass substrate surface, which was positioned in the inner part than 0.05 μm from the glass substrate surface. In addition, in the glass substrate of Comparative Example, the ratio of the sodium concentration in a depth of 0.01 μm from the glass substrate surface to the sodium concentration in a depth of 1 μm from the glass substrate surface was smaller than 0.02.

While the invention has been described in detail and with reference to specific embodiments thereof, it will be apparent to one skill in the art that various changes and modifications can be made therein without departing from the sprit and scope thereof.

This application is based on Japanese patent applications No. 2011-157469 filed on Jul. 19, 2011 and No. 2012-148148 filed on Jul. 2, 2012, the entire contents of which are incorporated hereinto by reference. All references cited herein are incorporated in their entirety.

INDUSTRIAL APPLICABILITY

The glass base material of the invention has excellent sodium feeding capability, so that the glass base material is preferred as a material for solar cells having a compound semiconductor.

The invention claimed is:

1. A glass base material which is used for solar cells, said glass base material comprising a composition of from 45 to 65% of $SiO_2$, from 1 to 18% of $Al_2O_3$, from 7 to 20% of the total content of $Li_2O$, $Na_2O$, and $K_2O$, from 0 to 12% of MgO, from 0 to 12% of CaO, from 0 to 18% of SrO, from 0 to 18% of BaO, and from 0 to 10% of $ZrO_2$, in terms of % by mass, wherein the composition is an average composition of the whole of the glass base material, and wherein on at least one surface thereof, a sodium concentration in a depth of 0.2 μm from the surface of the glass base material is 0.65 or larger in terms of a relative value relative to a sodium concentration in a depth of 1 μm from the surface of the glass base material;

wherein a sodium concentration distribution curve in a depth direction in the glass base material exhibits a bending point in a depth of smaller than 0.2 μm from the surface of the glass base material; and an average concentration gradient of sodium between the surface of the glass base material and the bending point is 2 or larger in terms of a relative value relative to an average concentration gradient of sodium between the bending point and a position in a depth of 0.2 μm from the surface of the glass base material.

2. The glass base material according to claim 1, wherein a potassium concentration distribution curve in a depth direction in the glass base material exhibits a minimum value in a depth of 0.05 μm or smaller from the surface of the glass base material.

3. The glass base material according to claim 1, wherein a strain point is 520° C. or higher.

4. The glass base material according to claim 1, wherein a sodium concentration in a depth of 0.01 μm from the surface of the glass base material is 0.02 or larger in terms of a relative value relative to a sodium concentration in a depth of 1 μm from the surface of the glass base material.

5. The glass base material according to claim 1, wherein a ratio of the sodium concentration in a depth of 0.01 μm from the surface of the glass base material to a total amount of a concentration of calcium, strontium and barium in a depth of 0.01 μm from the surface of the glass base material is 5 or larger.

6. The glass base material according to claim 1, wherein the content of $Al_2O_3$ in the composition is 11.1 to 18% in terms of % by mass, and a strain point is 520° C. or higher.

* * * * *